(12) United States Patent
Lo

(10) Patent No.: US 11,346,355 B2
(45) Date of Patent: *May 31, 2022

(54) AIR SHUTTER AND RADIATING FAN INCLUDING THE SAME

(71) Applicant: Nanning FuLian FuGui Precision Industrial Co., Ltd., Nanning (CN)

(72) Inventor: Hsin-Tien Lo, New Taipei (TW)

(73) Assignee: Nanning FuLian FuGui Precision Industrial Co., Ltd., Nanning (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/032,327

(22) Filed: Sep. 25, 2020

(65) Prior Publication Data

US 2021/0018011 A1     Jan. 21, 2021

Related U.S. Application Data

(63) Continuation of application No. 16/220,289, filed on Dec. 14, 2018, now Pat. No. 10,871,166.

(51) Int. Cl.
    *F04D 29/36*      (2006.01)
    *F04D 25/14*      (2006.01)
    (Continued)

(52) U.S. Cl.
    CPC ........... *F04D 25/14* (2013.01); *F04D 19/002* (2013.01); *F04D 29/329* (2013.01); *F04D 29/36* (2013.01);
    (Continued)

(58) Field of Classification Search
    CPC ........... H05K 7/20136; H05K 7/20145; H05K 7/20154; H05K 7/20163; H05K 7/20172;
    (Continued)

(56) References Cited

U.S. PATENT DOCUMENTS 3,270,656 A * 9/1966 Cook ...................... F24F 7/025
    454/352
6,031,717 A * 2/2000 Baddour .................. G06F 1/20
    361/679.48

(Continued)

FOREIGN PATENT DOCUMENTS

CN      104100567 A      10/2014
CN      206000758 U      3/2017

(Continued)

*Primary Examiner* — J. Todd Newton
*Assistant Examiner* — Theodore C Ribadeneyra
(74) *Attorney, Agent, or Firm* — ScienBiziP, P.C.

(57) ABSTRACT

An air shutter comprises a holder, two compressible elastic members, a plurality of blades, and two cover plates. The holder comprises a central hub, an outer frame and a plurality of connecting pieces, and the outer frame has two annular grooves for receiving the two compressible elastic members. Each of the plurality of blades locates between two adjacent connecting pieces and one end is pivotally connected to the central hub and the other end is pivotally connected to the two compressible elastic members. In a windless state, a gap between two adjacent connecting pieces is closed by one of the blades, and when the windless state changes to a windy state, each blade is rotated by a wind force and area of the gap expands with the increase of the wind force. A radiating fan comprising the air shutter is also provided.

20 Claims, 5 Drawing Sheets

(51) Int. Cl.
*G06F 1/20* (2006.01)
*F04D 29/32* (2006.01)
*F04D 19/00* (2006.01)
*H05K 7/20* (2006.01)

(52) U.S. Cl.
CPC ............... *G06F 1/20* (2013.01); *G06F 1/203* (2013.01); *H05K 7/20172* (2013.01)

(58) Field of Classification Search
CPC ... H05K 7/20181; F04D 25/14; F04D 19/002; F04D 29/329; F04D 29/36
See application file for complete search history.

(56) References Cited

U.S. PATENT DOCUMENTS

| | | | | |
|---|---|---|---|---|
| 6,174,232 | B1* | 1/2001 | Stoll | H05K 7/20172 361/695 |
| 7,182,047 | B1* | 2/2007 | Schwartz | F01P 5/06 123/41.04 |
| 7,306,426 | B2* | 12/2007 | Franz | F04D 27/008 415/123 |
| 9,388,825 | B1* | 7/2016 | Behbehani | F24F 7/007 |
| 10,660,235 | B2* | 5/2020 | Moreno | H05K 7/20172 |
| 2003/0091433 | A1* | 5/2003 | Tam | F04D 25/14 415/146 |
| 2008/0056900 | A1* | 3/2008 | Seidler | F04D 29/703 416/193 R |
| 2013/0017076 | A1* | 1/2013 | Li | F04D 25/14 415/201 |
| 2014/0308114 | A1* | 10/2014 | Tang | F04D 25/14 415/141 |
| 2016/0327062 | A1* | 11/2016 | Amin-Shahidi | H05K 7/20181 |
| 2017/0218978 | A1* | 8/2017 | Amin-Shahidi | F04D 25/14 |
| 2017/0321721 | A1 | 11/2017 | Huang et al. | |

FOREIGN PATENT DOCUMENTS

| | | |
|---|---|---|
| CN | 206539511 U * | 10/2017 |
| JP | S58102039 A | 6/1983 |
| TW | 201304674 A | 1/2013 |

* cited by examiner

AIR SHUTTER AND RADIATING FAN INCLUDING THE SAME

FIELD

The disclosure generally relates to air shutters.

BACKGROUNDING

Large scale networking devices such as routers and servers create large amounts of heat. At present, a fan is used for heat dissipation. In order to prevent debris such as dust from entering into the device through vents of the fan, an air shutter is generally added in front of the fan to provide protection.

Blades of an existing air shutter may be rotated and opened by wind force to ventilate and dissipate heat, and may be rotated and closed by gravity force. However, the air flow direction of the existing air shutter is single and the blades cannot support multi-directional installation due to gravity. Therefore, there is room for improvement within the art.

BRIEF DESCRIPTION OF THE DRAWING

Many aspects of the present disclosure can be better understood with reference to the drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connecting. The connecting can be such that the objects are permanently connected or releasably connected.

Figure 1:
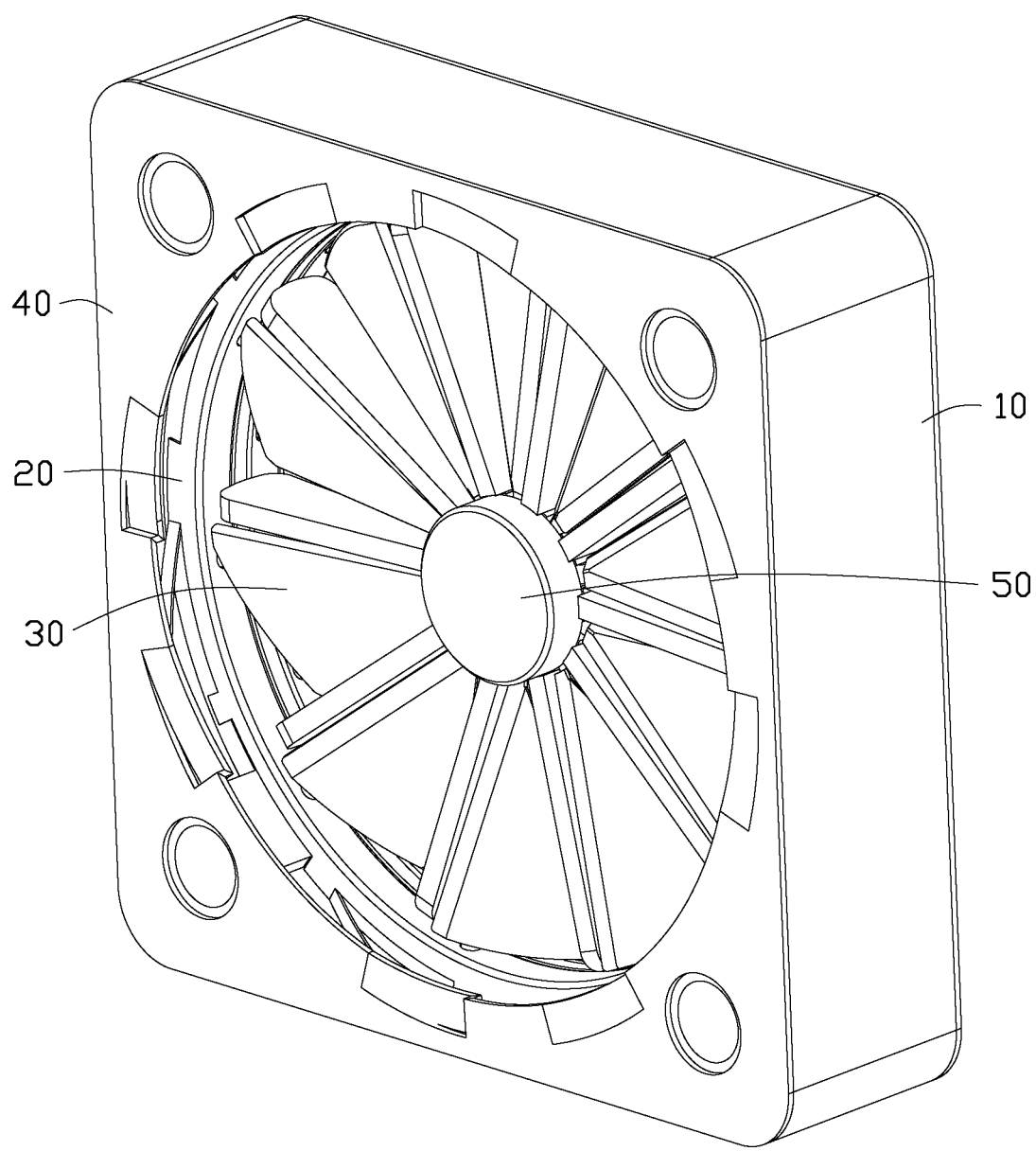
FIG. 1 is a perspective view of an air shutter in a windless state in accordance with an embodiment of the present disclosure.

FIG. 1 shows an air shutter 100 of an embodiment of the present disclosure. The air shutter 100 can include a holder 10, two compressible elastic members 20, a plurality of blades 30, two cover plates 40, and a shaft cap 50.

Figure 2:
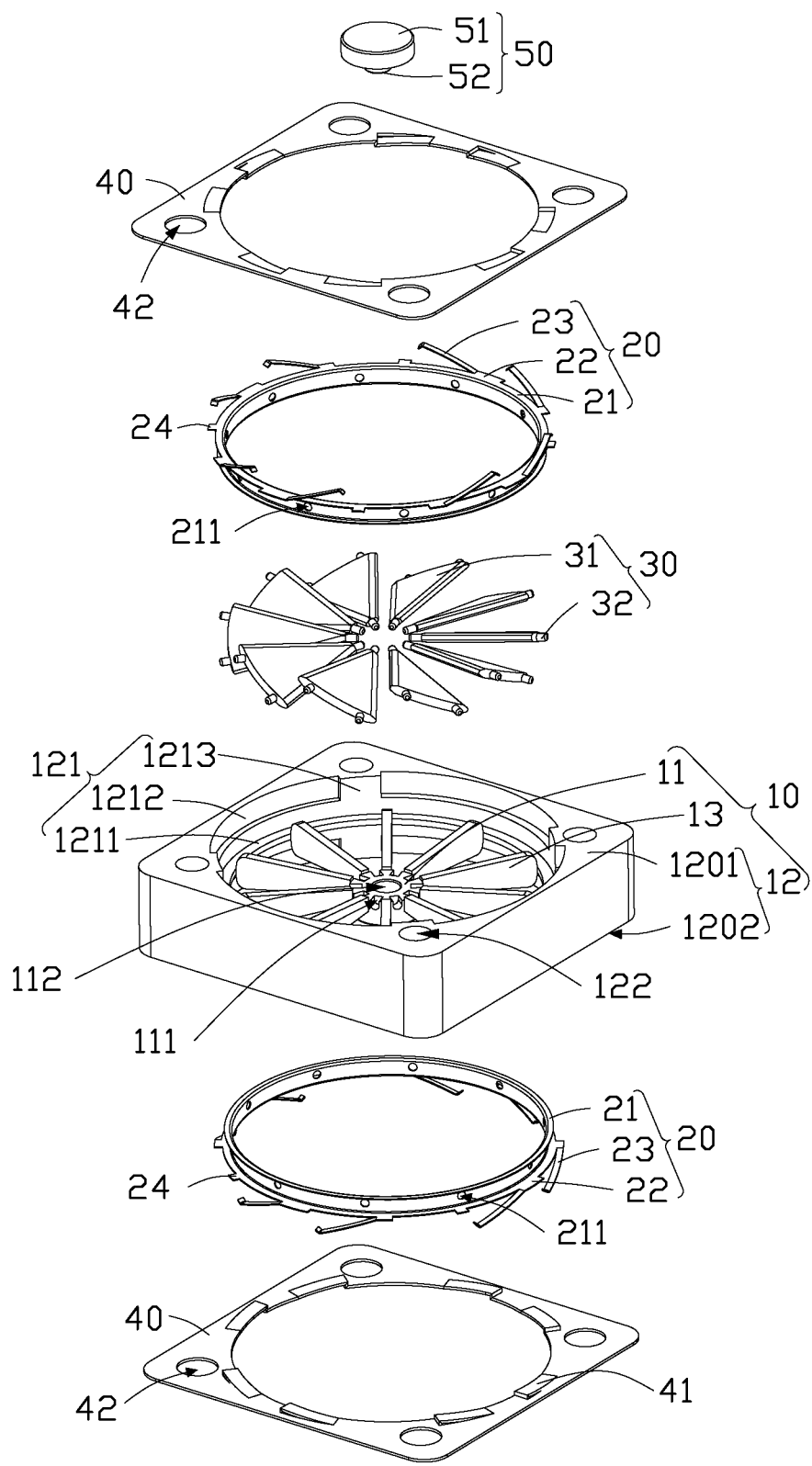
FIG. 2 is an exploded perspective view of the air shutter of FIG. 1.

FIG. 2 shows that the holder 10 includes a central hub 11, an outer frame 12, and a plurality of connecting pieces 13. The outer frame 12 can be sleeved outside the central hub 11. One end of each of the plurality of connecting pieces 13 is fixed to the central hub 11 and the other end is fixed to the outer frame 12. The connecting pieces 13 are radially and evenly distributed around the central hub 11.

In at least one embodiment, each connecting piece 13 is substantially in shape of long strip, and a height of the end of the connecting piece 13 that is fixed to the central hub 11 coincides with a thickness of the central hub 11 and is smaller than a height of the end of the connecting piece 13 that is fixed to the outer frame 12.

The outer frame 12 includes a first surface 1201 and a second surface 1202 parallel to the first surface 1201. A plane in which the connecting pieces 13 are located is positioned between the first surface 1201 and the second surface 1202. The plane of the connecting pieces 13 is parallel to the first surface 1201 and the second surface 1202.

The outer frame 12 defines two annular grooves 121 (only one annular groove is shown in FIG. 2), and the two annular grooves 121 are located on opposing sides of the plane of the connecting pieces 13. One of the two annular grooves 121 is located between the first surface 1201 and the plane of the connecting pieces 13, and the other one is located between the second surface 1202 and the plane of the connecting pieces 13.

Two compressible elastic members 20 are received in the two annular grooves 121. The two cover plates 40 are located at opposing sides of the outer frame 12 and limiting the two compressible elastic members 20. Specifically, one of the two cover plates 40 abuts against the first surface 1201, and the other one of the cover plates 40 abuts against the second surface 1202.

In the present embodiment, each annular groove 121 includes a first receiving portion 1211 and a second receiving portion 1212. The first receiving portion 1211 and the second receiving portion 1212 are substantially circular and coaxially positioned, and the second receiving portion 1212 is positioned away from the plane of the connecting pieces 13. The diameter of the second receiving portion 1212 is larger than that of the first receiving portion 1211. The central hub 11 is located on the central axis of the first receiving portion 1211 and the second receiving portion 1212. The distance between the second receiving portion 1212 and the central hub 11 is greater than the distance between the first receiving portion 1211 and the central hub 11.

Each compressible elastic member 20 includes an annular body 21, a plurality of flanges 22 and a plurality of elastic arms 23. The flanges 22 and the elastic arms 23 are extended from the annular body 21. The number of the flanges 22 is equal to that of the elastic arms 23. Each flange 22 has two opposing ends along a circumferential direction of the annular body 21. Each elastic arm 23 extends from one of the two opposing ends of the annular body 21, and the elastic arms 23 are located on same side of the flanges 22 along a circumference direction of the annular body 21.

In the present embodiment, there are eight flanges 22, two adjacent flanges 22 form a group, and four groups of flanges 22 are evenly spaced along a circumference direction of the annular body 21.

The annular body 21 is received in the first receiving portion 1211, and the elastic arms 23 extending from same annular body 21 are received in a second receiving portion 1212. In one embodiment, the annular groove 121 are not divided into the first receiving portion 1211 and the second receiving portion 1212. The first receiving portion 1211 and the second receiving portion 1212 of the present embodiment can be better adapted to the shape of the compressible elastic member 20.

Each annular groove 121 further includes a plurality of limiting members 1213 positioned in the second receiving portion 1212, the limiting members 1213 are spaced apart from each other. Each of the compressible elastic members 20 further includes a plurality of limiting blocks 24 extended outward from edge of the annular body 21. The number of the limiting members 1213 is equal to that of the limiting blocks 24. Each of limiting block 24 is matched with a limiting member 1213 to limit the rotation angle of the compressible elastic members 20.

In the present embodiment, there are four limiting members 1213 and four limiting blocks 24. A limiting block 24 is located between every two groups of flanges 22.

One side of each of the cover plates 40 positioned adjacent to the compressible elastic members 20 includes a plurality of wedge blocks 41. The number of the wedge blocks 41 coincides with the number of the elastic arms 23. Each of the elastic arms 23 is capable of sliding along an inclined surface of the wedge blocks 41. Specifically, the annular body 21 is positioned in parallel with the cover plate 40, and the extending direction of the elastic arm 23 is opposite to the inclination direction of the wedge block 41. It should be noted that the inclination direction of the wedge block 41 is directed from the higher end of the inclined surface to the lower end. When the elastic arm 23 is in contact with a wedge block 41, the extending direction of the elastic arm 23 is parallel to the inclined surface.

The number of the blades 30 is equal to that of the connecting pieces 13. Each of the plurality of blades 30 is located between two adjacent connecting pieces 13, and one end of the blade 30 is connected to the central hub 11 and capable of rotating relative to the central hub 11. The other end of the blade 30 is connected to the two compressible elastic members 20 and capable of rotating relative to the two compressible elastic members 20.

Gap between two adjacent connecting pieces 12 is substantially fan-shaped. The blade 30 is also substantially fan-shaped to be able to close the gap between two adjacent connecting pieces 12.

Size of the blade 30 is same as or slightly larger than the gap between two adjacent connecting pieces 12. When the size of the blade 30 is slightly larger than the gap, the blade 30 is inclined with respect to the plane of the connecting pieces 13 in a state of closing. In one embodiment, the size of the blade 30 is slightly smaller than the gap between two adjacent connecting pieces 12 to allow for assembly error.

Each of the blades 30 includes a scalloped body 31 and three convex shafts 32 protruding from the scalloped body 31. One of the three convex shafts 32 is located at one end of the scalloped body 31 adjacent to its central angle and is pivotally fitted with the central hub 11. The remaining two convex shafts 32 are located at the other end of the scalloped body 31 that is positioned away from the central angle. Each of the blades 30 is located between two adjacent connecting pieces 13 and is pivotally fitted with the two compressible elastic members 20 through the remaining two convex shafts 32.

In the present embodiment, the edge of the central hub 11 defines a plurality of shaft slots 111. The number of the shaft slots 111 of the blades 30, and the number of the shaft slots 111 of the connecting pieces 13 are same. Each of the plurality of shaft slots 111 is located in the middle of two adjacent connecting pieces 13. The annular body 21 defines a plurality of shaft holes 211 with an equal number of the shaft slots 111, and the shaft holes 211 are evenly spaced along a circumferential direction of the annular body 21. One of the three convex shafts 32 is received in a shaft slot 111, and the remaining two convex shafts 32 penetrate through two shaft holes 211 of the two compressible elastic members 20.

The shaft cap 50 may cooperate with the central hub 11 to limit one end of the blade 30. Specifically, the shaft cap 50 includes a cap body 51 and a locating portion 52 protruding from one side of the cap body 51. The central hub 11 further includes a locating slot 112 for receiving the locating portion 52. The shaft cap 50 and the central hub 11 are fixed by the locating portion 52 and the locating slot 112.

In the present embodiment, the locating portion 52 has an external thread, the locating slot 112 has an internal thread, and the locating portion 52 may be screwed into the locating slot 112.

The outer frame 12 defines a plurality of first fixing holes 122, and each of the cover plates 40 defines a plurality of second fixing holes 42 in a one-to-one correspondence with the first fixing holes 122. In the present embodiment, the outer frame 12 and the two cover plates 40 are fixed by screws 60 screwing into one of the first fixing holes 122 and a second fixing hole 42.

Figure 3:
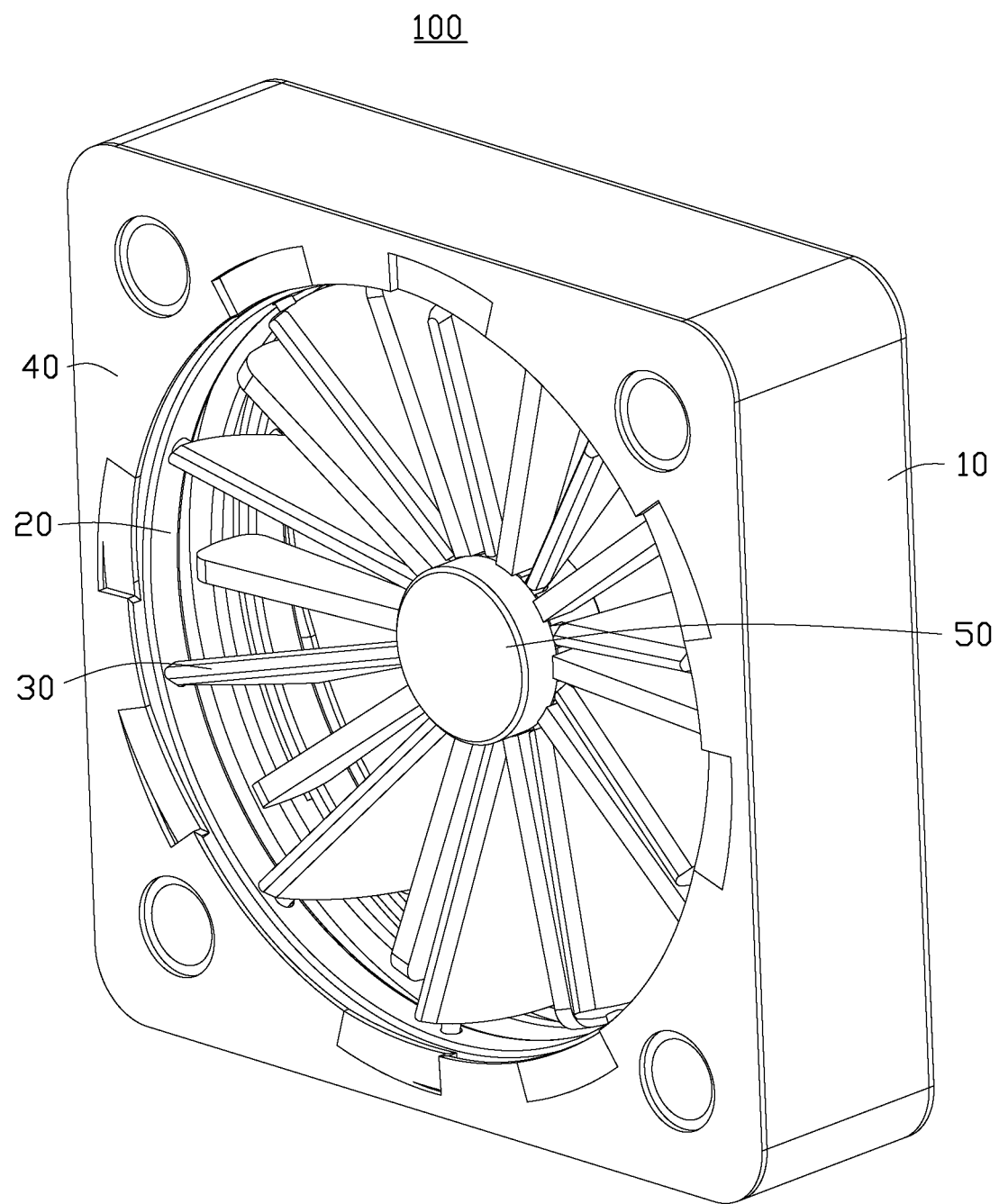
FIG. 3 is a perspective view of the air shutter as shown in FIG. 1 in a windy state.
Figure 4:
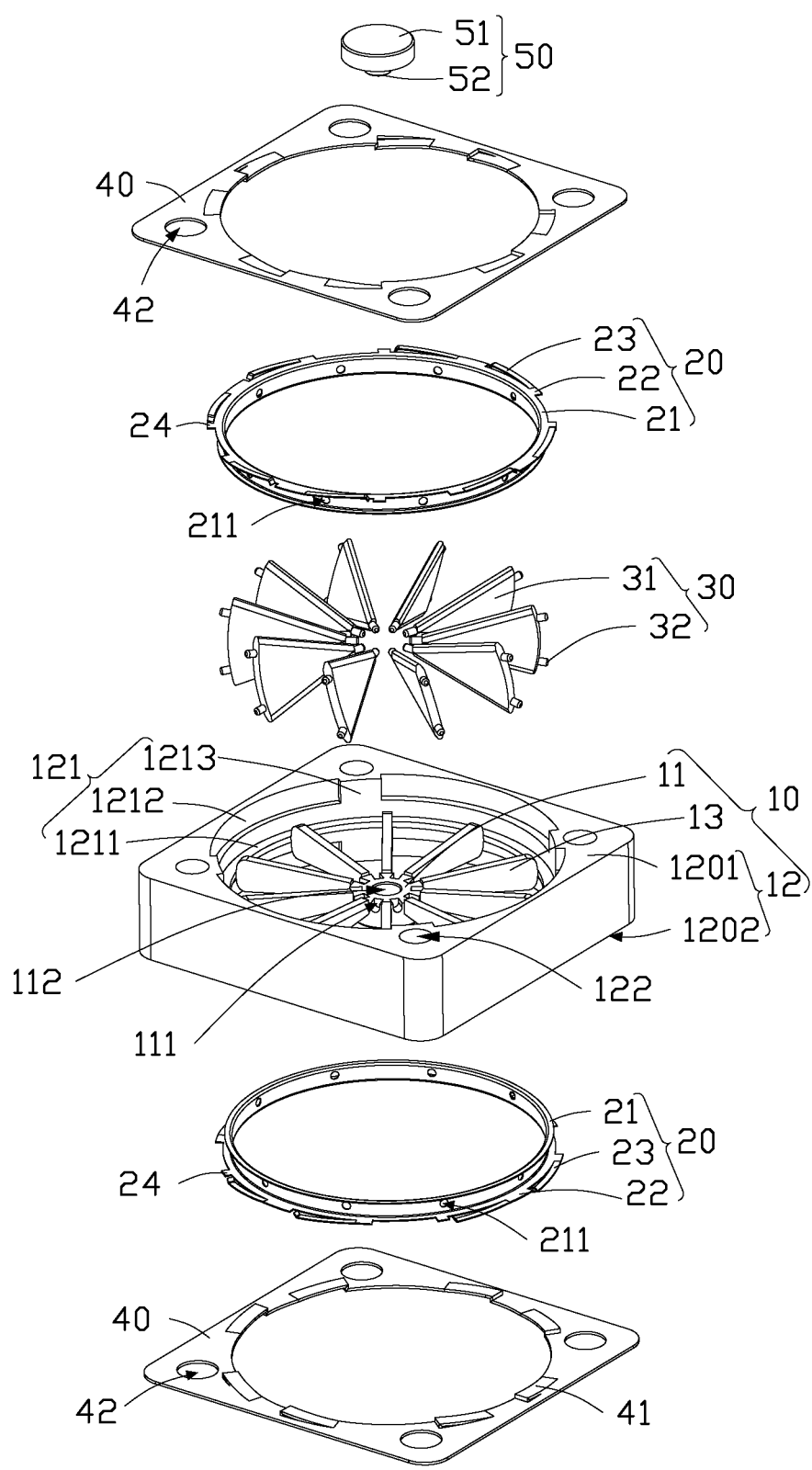
FIG. 4 is an exploded perspective view of the air shutter of FIG. 3.

As shown in FIG. 1 to FIG. 2, in a windless state, each of the blades 30 closes the gap between two adjacent connecting pieces 12. As shown in FIG. 3 to FIG. 4, when the windless state changes to a windy state, each of the blades 30 is rotated by a wind force and the gap between two adjacent connecting pieces 12 expands with the increase of the wind force. When the windy state changes to the windless state, each of the blades 30 is rotated by a resilient force of the two compressible elastic members 20 and closes the gap between two adjacent connecting pieces 12.

It can be understood that the blade 30 rotates with wind and can adjust area of the gap between two adjacent connecting pieces 13 according to strength of the wind. When the wind is strong, the gap between two adjacent connecting pieces 13 is correspondingly enlarged to facilitate the air flow.

Specifically, when the windless state changes to the windy state, each of the blades 30 is rotated under the wind force to expand the gap between two adjacent connecting pieces 13. At this time, the distance between the two compressible elastic members 20 increases, a free end of each of the elastic arms 23 slides from the lower end of the wedge block 41 to the higher end and stores elastic potential energy.

Specifically, when the windy state changes to the windless state, each of the blades 30 is rotated by the resilient force generated by the release of the elastic potential energy stored by the two compressible elastic members 20. At this time, the free end of each of the elastic arms 23 slides from the higher end of the wedge block 41 to the lower end, the distance between the two compressible elastic members 20 decreases, and area of the gap between two connecting pieces 13 decreases and eventually closed by one of the blades 30.

It should be noted that each of the compressible elastic members 20 is forced to rotate in the circumferential direction of the annular body 21 when the blades 30 rotate, and rotation directions of the two compressible elastic members 20 are opposite. When the compressible elastic member 20 rotates, each of the limiting blocks 24 slides between adjacent two limiting members 1213 along the circumferential direction of the annular groove 121.

For ease of understanding, angle of rotation of the blades 30 and the compressible elastic members 20 is exemplified as follows. When the windless state changes to the windy state, each of the blades 30 is rotated by the wind force with a rotation angle of 50° with respect to a closed state and drives each of the two compressible elastic members 20 to rotate with a rotation angle of 7°, and the two compressible elastic members 20 rotate in opposing directions. When returning to the windless state, each of the two compressible elastic members 20 is reversely rotated with a rotation angle of 7° by the resilient force of the elastic arms 23, and the distance between the two compressible elastic members 20 is decreased, thereby driving the blades 30 to rotate with a rotation angle of 50°, returning to the closed state.

Figure 5:
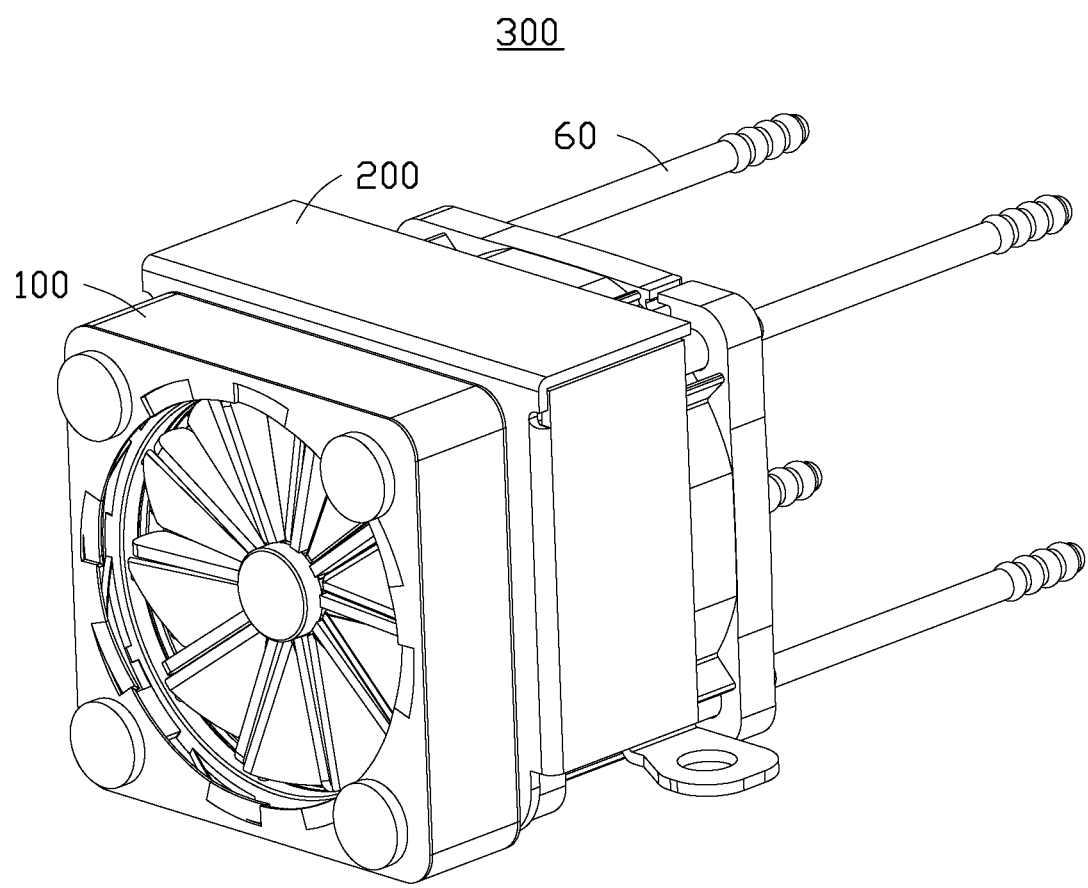
FIG. 5 is a perspective view of a radiating fan in accordance with an embodiment of the present disclosure.

Referring to FIG. 5, an embodiment of the present disclosure provides a radiating fan 300. The radiating fan 300 includes the air shutter 100 described in any one of embodiments above, and a wind generating mechanism 200. The wind generating mechanism 200 is attached to one side of the air shutter 100 and the air outlet surface of the wind generating mechanism 200 is positioned in parallel with the plane of the connecting pieces 12.

In the present embodiment, the air shutter 100 is fixed to the wind generating mechanism 200 by screws 60. Specifically, the air shutter 100 and the wind generating mechanism 200 are fixed by screws 60 screwing into one of the first fixing holes 122 and a second fixing hole 42.

When the radiating fan 300 is applied to a large scale networking device such as a router or a server for heat dissipation, the wind generating mechanism 200 can be received in a housing of the device. The air shutter 100 can be mounted on the housing of the device and positioned to correspond to the wind generating mechanism 200. Therefore, the wind generating mechanism 200 can operate to exchange air inside and outside the housing of the device.

It should be noted that the blades 30 can rotate at certain angles in the windy state and can be reversely rotated by the resilient force of the two compressible elastic members. Therefore, the mounting orientation of the air shutter 100 or the radiating fan 300 is not limited by gravity.

The embodiments shown and described above are only examples. Many details are often found in the art such as the other features of a control circuit. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. An air shutter, comprising:
    a central hub;
    an outer frame around the central hub and comprising two annular grooves on opposite sides of the outer frame;
    two compressible elastic members, each movably received in a respective one of the annular grooves; and
    a plurality of blades, each of the blades comprising a first shaft pivotally connected to the central hub and two second shafts pivotally connected to the compressible elastic members,
    wherein the compressible elastic members apply a resilient force to the blades to rotate the blades, thereby changing a distance between the compression elastic members;
    wherein if the blades are rotated by wind forces, the distance between the compressible elastic members is increased; and
    wherein if the blades are not rotated by wind forces, the distance between the compressible elastic members is decreased to apply the resilient force on the blades.

2. The air shutter as claimed in claim 1, wherein each of the blades comprises a scalloped body, the first shaft and the second shafts protrude from the scalloped body, the first shaft is at an end of the scalloped body.

3. The air shutter as claimed in claim 1, comprising two cover plates on opposing sides of the outer frame and each configured for limiting positions of the compressible elastic members,
    wherein each of the compressible elastic members comprises an annular body, a plurality of flanges extending outward from an edge of the annular body, and a plurality of elastic arms extending from one end of the flanges, one side of each of the cover plates comprises a plurality of wedge blocks, and each of the elastic arms is slidable on an inclined surface of one of the wedge blocks.

4. The air shutter as claimed in claim 3, wherein the central hub comprises a plurality of shaft slots, each of the annular bodies comprises a plurality of shaft holes, each of the first shafts is received in a respective one of the plurality of shaft slots to pivotally fit with the central hub, and each of the second shafts penetrates through the respective one of the plurality of shaft holes of the annular bodies.

5. The air shutter as claimed in claim 3, wherein each of the annular grooves comprises a first receiving portion configured for receiving one of the annular bodies; and a second receiving portion configured for receiving the elastic arms; and a distance between the second receiving portion and the central hub is greater than a distance between the first receiving portion and the central hub.

6. The air shutter as claimed in claim 5, wherein the first receiving portion and the second receiving portion are circular and coaxially positioned, and the central hub is on a central axis of the annular grooves.

7. The air shutter as claimed in claim 5, wherein each of the annular grooves comprises a plurality of limiting members in the second receiving portion and are spaced apart from each other, each of the compressible elastic members comprises a plurality of limiting blocks extending outward from an edge of the annular body, and each of the limiting blocks cooperates with a respective one of the limiting members to limit rotation angles of the compressible elastic member.

8. The air shutter as claimed in claim 1, further comprising:
    a shaft cap comprising a cap body and a locating portion protruding from one side of the cap body, wherein the central hub comprises a locating slot configured for receiving the locating portion to limit one end of each of the blades.

9. The air shutter as claimed in claim 1, wherein each of the compressible elastic members rotates in a circumferential direction of the annular grooves when the blades rotate, and each of the compressible elastic members rotate in an opposite direction to each other.

10. The air shutter as claimed in claim 1, comprising two cover plates on opposing sides of the outer frame and each is configured for limiting positions of the compressible elastic members,
wherein the outer frame comprises a plurality of first fixing holes, each of the cover plates comprises a plurality of second fixing holes, and the outer frame and the cover plates are fixed by screws screwing into each of the first fixing holes and a respective one of the second fixing holes.

11. A radiating fan, comprising:
a wind generating mechanism; and
an air shutter attaching to one side of the wind generating mechanism and comprising:
  a central hub;
  an outer frame around the central hub and comprising two annular grooves at opposite sides of the outer frame;
  two compressible elastic members, each movably received in a respective one of the annular grooves; and
  a plurality of blades, each of the blades comprising a first shaft pivotally connected to the central hub and two second shafts pivotally connected to the compressible elastic members,
wherein the compressible elastic members apply a resilient force to the blades to rotate the blades, thereby changing a distance between the compression elastic members;
wherein if the blades are rotated by wind forces, the distance between the compressible elastic members is increased; and
wherein if the blades are not rotated by wind forces, the distance between the compressible elastic members is decreased to apply the resilient force on the blades.

12. The radiating fan as claimed in claim 11, wherein each of the blades comprises a scalloped body, the first shaft and the second shafts protrude from the scalloped body, the first shaft is at an end of the scalloped body.

13. The radiating fan as claimed in claim 11, comprising two cover plates on opposing sides of the outer frame and each configured for limiting positions of the compressible elastic members,
wherein each of the compressible elastic members comprises an annular body, a plurality of flanges extending outward from an edge of the annular body, and a plurality of elastic arms extending from one end of the flanges, one side of each of the cover plates comprises a plurality of wedge blocks, and each of the elastic arms is slidable on an inclined surface of one of the wedge blocks.

14. The radiating fan as claimed in claim 13, wherein the central hub comprises a plurality of shaft slots, each of the annular bodies comprises a plurality of shaft holes, each of the first shafts is received in a respective one of the plurality of shaft slots to pivotally fit with the central hub, and each of the second shafts penetrates through the respective one of the plurality of shaft holes of the annular bodies.

15. The radiating fan as claimed in claim 13, wherein each of the annular grooves comprises a first receiving portion configured for receiving one of the annular bodies; and a second receiving portion configured for receiving the elastic arms; and a distance between the second receiving portion and the central hub is greater than a distance between the first receiving portion and the central hub.

16. The radiating fan as claimed in claim 15, wherein the first receiving portion and the second receiving portion are circular and coaxially positioned, and the central hub is on a central axis of the annular grooves.

17. The radiating fan as claimed in claim 15, wherein each of the annular grooves comprises a plurality of limiting members in the second receiving portion and are spaced apart from each other, each of the compressible elastic members comprises a plurality of limiting blocks extending outward from an edge of the annular body, and each of the limiting blocks cooperates with a respective one of the limiting members to limit rotation angles of the compressible elastic member.

18. The radiating fan as claimed in claim 11, further comprising:
a shaft cap comprising a cap body and a locating portion protruding from one side of the cap body, wherein the central hub comprises a locating slot configured for receiving the locating portion to limit one end of each of the blades.

19. The radiating fan as claimed in claim 11, wherein each of the compressible elastic members rotates in a circumferential direction of the annular grooves when the blades rotate, and each of the compressible elastic members rotate in an opposite direction to each other.

20. The radiating fan as claimed in claim 11, comprising two cover plates on opposing sides of the outer frame and each is configured for limiting positions of the compressible elastic members,
wherein the outer frame comprises a plurality of first fixing holes, each of the cover plates comprises a plurality of second fixing holes, and the outer frame and the cover plates are fixed by screws screwing into each of the first fixing holes and a respective one of the second fixing holes.

\* \* \* \* \*